United States Patent [19]

Land

[11] 4,366,235

[45] Dec. 28, 1982

[54] PHOTOSENSITIVE ELEMENT AND METHOD OF PREPARING SAME

[75] Inventor: Edwin H. Land, Cambridge, Mass.

[73] Assignee: Polaroid Corporation, Cambridge, Mass.

[21] Appl. No.: 234,937

[22] Filed: Feb. 17, 1981

[51] Int. Cl.³ .............................................. G03C 1/76
[52] U.S. Cl. ................................... 430/496; 430/495; 430/567; 430/568; 430/569; 430/322; 430/324; 430/414; 430/416; 430/417; 430/932
[58] Field of Search ..................... 430/7, 11, 154, 155, 430/202, 207, 212, 213, 217, 228, 231, 236, 238, 307, 306, 322, 324, 244, 245, 247, 271, 338, 346, 365, 375, 376, 382, 390, 403, 495, 496, 510, 414, 416, 417, 511, 517, 523, 571, 592, 939, 950, 567, 568, 569; 350/317; 428/117

[56] References Cited

U.S. PATENT DOCUMENTS

| | | | |
|---|---|---|---|
| 1,982,967 | 12/1934 | Sites | 430/307 |
| 2,145,306 | 1/1939 | Adams | 430/307 |
| 3,019,124 | 1/1962 | Rogers | 430/496 |
| 3,650,748 | 3/1972 | Yudelson et al. | 430/416 |
| 3,779,775 | 12/1973 | Chiba | 430/495 |
| 3,894,871 | 7/1975 | Land | 430/228 |
| 4,092,169 | 5/1978 | Kumasaka | 430/596 |
| 4,217,405 | 8/1980 | Benton | 430/414 |

FOREIGN PATENT DOCUMENTS 2042753 9/1980 United Kingdom .

OTHER PUBLICATIONS

Dainty, J. D. and Shaw, R. "Image Science", Academic Press (1974) Chapters 1 and 3.

*Primary Examiner*—Mary F. Downey
*Attorney, Agent, or Firm*—Philip G. Kiely

[57] ABSTRACT

A photosensitive element comprising a support carrying photosensitive silver halide grains in a substantially predetermined spaced array and methods for forming such photosensitive elements.

102 Claims, 16 Drawing Figures

PHOTOSENSITIVE ELEMENT AND METHOD OF PREPARING SAME

BACKGROUND OF THE INVENTION

Conventional silver halide emulsion layers contain grains which are randomly dispersed with respect to one another. This random distribution of silver halide grains on a projected area basis is non-uniform, which may give rise to undesirable variation in image density which is a significant source of image noise in photographic systems.

Contributions to the undesirable variation in image density of a photographic image come from many sources. Principally, the random nature of the absorption of the light quanta by the individual photoreceptors, e.g., silver halide grains; variations in the final effect on the image visual density of each photoreceptor; and the random spatial distribution of the photoreceptors. Discussions of such effects are available in standard texts, in particular, Image Science, by J. D. Dainty and R. Shaw, Academic Press (1974), Chapters 1 and 3.

The desirability of forming photosensitive silver halide emulsions wherein the photosensitive grains are in a predetermined spaced array, that is, the grains are spaced symmetrically and apart from each other, has long existed in the art. A regular array of photoreceptors would eliminate the last of the above-mentioned contributions. It would have a greater effect as more of the photoreceptors participate in the image formation. When all photoreceptors contribute to the image, a regular array would produce no array-based density variation, whereas a random array produces a root mean square (RMS) image density variation proportional to the image density of the array. For conventional photographic systems this effect will be maximum at high negative densities, i.e., the more exposed parts of the image. For diffusion transfer positive images, this effect will be maximum at high positive densities; i.e., the less exposed parts of the image. The maximum contribution of the array variations could be reduced to substantially no macroscopic variation in these regions by using a regular array of photoreceptors.

The reduction in the variation in image density is less but still significant in intermediate exposure regions. A model calculation by G. Langner in "Zur Berechnung der Körnigkeit und der Kontrastschwelle photographischer Schichten" in Photogr. Korres. 99, 177 (1963) (see also p. 103 of Dainty and Shaw, above) comparing the theoretical means square variation in density for identical grains distributed randomly and regularly shows that this variation will be maximum in a regular array at half of the maximum density, where it will be only half of the variation expected in a random array of similar grains. At all density levels above zero the regular array would have a lower variation than the random array, although this difference would become small at low densities.

For a product in which all photoreceptors contribute to the image density at all density levels, for example, a transparency in which both the positive and negative images remain, see for example, U.S. Pat. No. 3,894,871, issued July 15, 1975 to Edwin H. Land, the variation in image density from a regular array would be significantly less than that from a random array at all density levels.

It will also be seen that the problem of clumping or agglomeration of silver halide grains would be virtually eliminated by a regular array of grains.

U.S. Pat. No. 3,019,124 is directed to a method of manufacturing photographic elements having at least two sets of submacroscopic elemental portions systematically arranged in a screen pattern. This method comprises applying a first light sensitive layer in a uniform thickness to a support, embossing the coated layer to form a relief impression having systematically arranged spaced-apart elevated surface sections joined by depressed sections interspersed therebetween, and applying a second light sensitive layer having a different spectral sensitivity to fill the depressions remaining in the surface to the level of the raised sections. This embossing and coating may be repeated to provide third areas of different sensitivity. While the resulting array of photosensitive areas is regular, the silver halide grains still are randomly arrayed within each photosensitive area.

SUMMARY OF THE INVENTION

The present invention is directed to a photosensitive element comprising a support carrying photosensitive silver halide grains in a substantially predetermined spaced array. By means of the novel processes of the present invention such photosensitive elements are prepared having the grains in a predetermined spaced array.

DETAILED DESCRIPTION OF THE INVENTION

Figure 1:
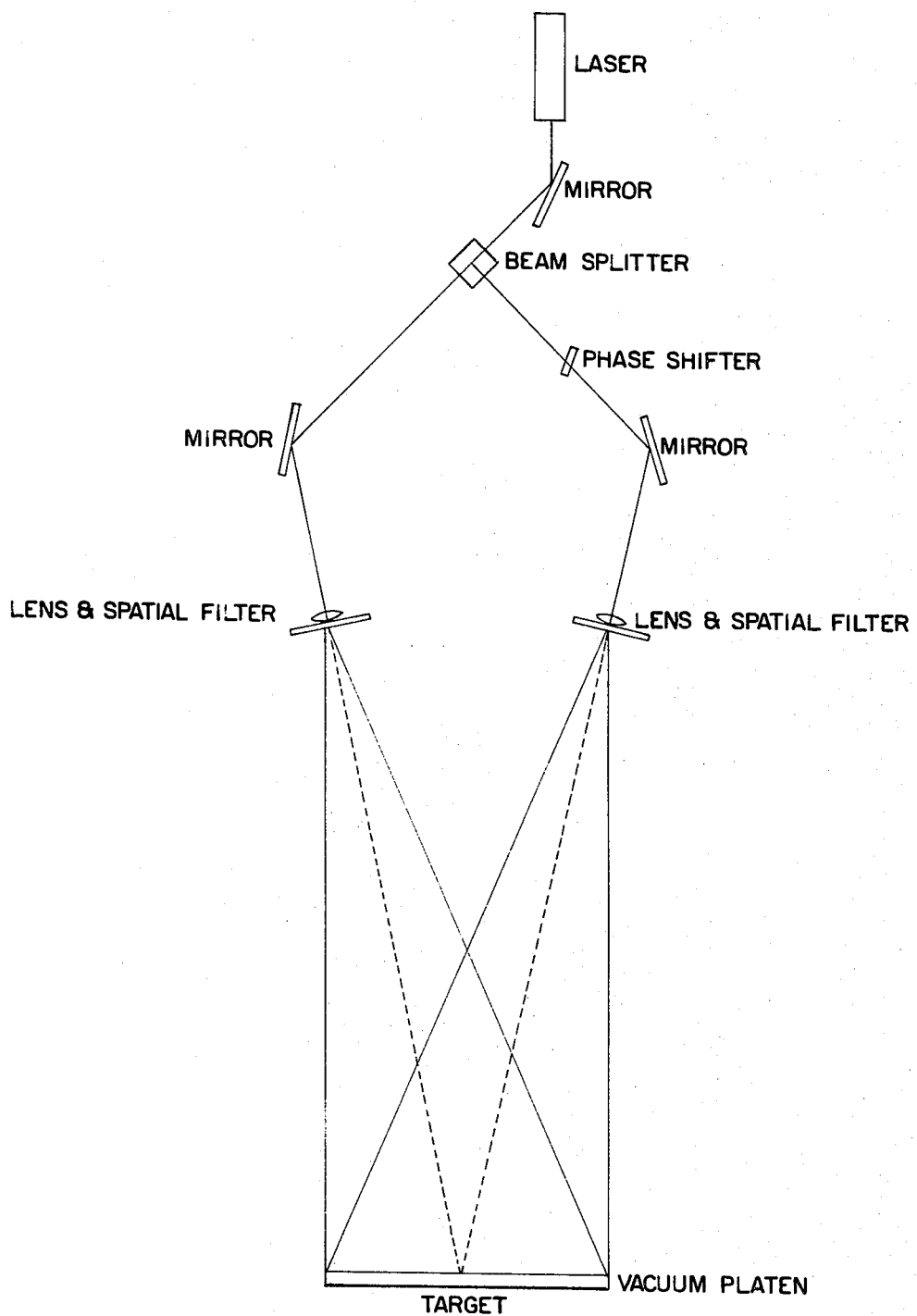
FIG. 1 is a diagrammatic representation of a preferred exposure system for use in the present invention.

The present invention comprises the formation of a predetermined spaced array of sites adapted to form silver halide grains and forming silver halide grains at said sites. By forming the sites in a predetermined spatial relationship, if silver halide grains are formed only at the sites, each of the grains will also be located at a predetermined and substantially uniform distance from the next adjacent grain and their geometric layout will conform to the original configuration of the sites.

In the present invention, substantially each site contains a single effective silver halide grain. The term "single effective silver halide grain", as used herein, is intended to refer to an entity at each site which functions photographically as a single unit which may or may not be crystallographically a single crystal but wherein the entire unit can participate in electronic and ionic processes such as latent image formation and development.

Preferably, the sites are formed by exposing a photosensitive material to a regular pattern of radiation actinic to said photosensitive material; developing the so-exposed photosensitive material to provide sites for the generation of silver halide corresponding to the pattern of exposure and then forming photosensitive silver halide grains at the sites. For example, in one embodiment, the sites are provided by the predetermined pattern exposure of a photoresist whereby, upon development of the exposed photosensitive material, a relief pattern is obtained which comprises the above-described sites.

The exposure of the photosensitive material is preferably carried out by interfering coherent radiation in order to provide sites with the desired spacing therebetween.

It is known in the art to form relief diffraction gratings employing laser interference techniques. In general, such gratings are formed by exposing a photosensitive material such as a photoresist to two coherent interfering laser beams whose wave fronts are substantially plane and parallel. When such beams interfere there is produced a stationary periodic fringe pattern consisting of maxima and minima of intensity. The spacing between adjacent maxima (or minima) is determined by the angle between the beams and the wavelength of the exposing light. Depending upon the optical system used, substantially any spacing can be obtained down to about half the wavelength of the exposing light. The photosensitive material will thus be exposed to a periodic variation in intensity across its surface.

This description applies to the formation of straight line gratings; that is, the maxima or minima of the developed image appear as straight parallel lines viewed normal to the surface. A crossed grating structure can be obtained by rotating the photosensitive material 90° about an axis perpendicular to the center of the surface subsequent to the first exposure and exposing a second time. In this case the surface is subjected to two periodic intensity variations at right angles to each other.

If such photosensitive material is a positive photoresist, then upon application of a developer those areas receiving the largest exposure will be preferentially etched away over those areas receiving the least exposure. After sufficient development time, the photoresist surface will be a periodic relief pattern whose depth depends on the original interference exposure. Positive photoresist is rendered soluble by impinging light and thereby susceptible to etching by the developer. Alternatively, a photoresist could be chosen which would harden upon photoexposure (negative-acting photoresist) whereupon the unexposed areas would be dissolved by appropriate treatment.

As examples of positive-acting photoresists mention may be made of initially hydrophobic, low molecular weight resins containing sensitizers, which, upon absorbing radiation change the solubility of the coating from solvent-soluble to water-soluble. Suitable resins include phenol formaldehyde novolaks, novolaks in combination with styrene, methyl styrene and styrene-maleic anhydride copolymers and melamines.

As examples of representative negative-acting photoresists mention may be made of polyvinyl cinnamate derivatives, vinyl ester containing cinnamylidene and alkyl ester prepolymers.

Additional details regarding positive and negative photoresist may be found, for example in W. S. DeForest, *PHOTORESIST MATERIALS AND PROCESSES*, McGraw-Hill, N.Y., 1975.

Upon development, in the case of the crossed grating exposure, the resulting relief structure will, in general, consist of a rectangular array of peaks and valleys; in the case of a positive photoresist the valleys corresponding to those areas where the combined intensity of the two exposures was largest, and the peaks, to those areas where the exposure was the least.

Line patterns formed by laser beam interference have been used to produce crystals in a specific crystallographic orientation.

"Orientation of Crystalline Overlayers on Amorphous Substrates by Artificially Produced Surface Relief Structure" by Dale Clifton Flanders, submitted in partial fulfillment of the requirements for the degree of Doctor of Philosophy, Massachusetts Institute of Technology, Cambridge, Mass., January 1978 describes linear relief structures and the growing of potassium chloride crystals thereon. The crystals assumed the orientation of the substrate and were randomly located along the troughs of the relief pattern and non-uniform in size. The linear relief structure in the substrate was produced by soft X-ray lithographic exposure through a mask produced by laser beam interference followed by reactive-ion-etching. Similar procedures are described in Appl. Phys. Lett., Vol. 32, No. 6, Mar. 15, 1978, P. 349–350.

In Scanning Electron Microscopy, 1978, Vol. 1, SEM Inc., A. M. F., O'Hare, Ill., p. 33–40, there is set forth a procedure for fabricating gratings having linewidths of 100 nm and less wherein a photoresist is exposed to radiation in some desired pattern. It is stated that, "The radiation can be a scanned beam, a focused optical or electron image, a hologram, or an optical or X-ray shadow of a mask. Following exposure, a development step removes either the exposed or unexposed regions (i.e., positive or negative resist), thereby leaving a resist pattern in relief on the substrate surface."

See, also, "Sinusoidial Relief Gratings for Zero Order Reconstruction of Black and White Images", Optics Communications, August 1976, Vol. 18, No. 3, Pgs.

complex of silver ion capable of being decomplexed to form photosensitive silver halide grains including water-soluble complexes of silver ion complexed with thiocyanate and water-soluble complexes of silver ion complexed with halide and thiocyanate.

To form a useful photographic element the silver halide grains should range from about 0.1 to 3.0 μm in mean diameter and the spacing between grains should be equal to or less than the unit spacing distance. Preferably, the grains are about 0.5 to 2 μm apart, center to center. Of course, the actual spacing and grain diameter, as well as site generation pattern will be determined by the particular purpose for which the photographic element is to be employed. The coverage of the grains is preferably such as to cover at least 25% of the area of the support and preferably 50% or more.

A particularly preferred method for forming a photosensitive silver halide emulsion in a polymer substrate by applying a solution of a water-soluble polymer and a water-soluble complex of silver is described and claimed in copending application of Vivian K. Walworth, Ser. No. 234,936, filed concurrently herewith and commonly assigned.

The polymer applied to the relief pattern is water-permeable to permit the water solutions of the complexes to be imbibed therein. In a preferred embodiment, the polymers are also permeable to aqueous alkaline solution to permit photographic processing compositions applied to photographic elements formed by means of the present invention to penetrate to the grains.

The above-described permeable polymer layer to which the solution of water-soluble complex of silver ion is applied, may contain various materials to assist in nucleating the silver halide and/or modifying the halide content of the grain. Such materials include water-soluble halide salts, particulate matter and the like. In addition, the permeable polymeric layer may include chemical and spectral sensitizing agents in order to sensitize the grains formed therein.

In order to generate silver halide grains on the sides of the peaks, the vacuum deposition of silver at an angle, preferably a grazing angle, preferentially deposits metallic silver on the sides of the peaks, i.e., intermediate the top of the peak and bottom of the valley. By this method, a specific deposition occurs with relation to each peak and the remainder of the relief pattern remains substantially free of deposited silver. Halogenating the deposited silver converts it to silver halide, thus providing silver halide crystals in the above-described spaced array, located on the sides of the peaks or projections.

Alternatively, silver halide may be vacuum deposited at an angle to the plane of the relief pattern resulting in a predetermined spaced array of grains without the necessity of conversion to the halide.

In order to provide additional grain growth, the thus-formed silver halide grains may be contacted with a solution of a water-soluble complex of silver ion.

In still another embodiment, instead of halogenating the vacuum-deposited silver, a layer of polymer may be applied and then a solution of a water-soluble complex of silver halide complexed with excess halide may be applied, thereby forming silver halide grains in the polymer layer overlying the vacuum deposited silver.

In a particularly preferred embodiment, a spaced array of silver halide grains is formed in an embossed relief pattern by depositing a fine-grain silver halide emulsion on said embossed relief pattern in a manner such that substantially all the emulsion is deposited in the depressions in the relief pattern. After drying the fine-grain emulsion, a silver halide solvent is applied to the deposited fine-grain emulsion, thereby at least partly dissolving the grains. Activation of the solvent, e.g., by heating, is then carried out, resulting in a coalescence of the grains whereby substantially each of the depressions in the relief pattern contains an effective single silver halide grain. Chemical sensitization can be carried out either before or subsequent to coalescence.

In addition to relief pattern formation, another method for the formation of sites in a photosensitive material adapted to preferentially generate silver halide grains at those sites utilizes as the photosensitive material an ultra-fine-grained or substantially grainless material which, upon predetermined pattern exposure as described above and chemical or thermal development, provides nuclei or sites for silver halide growth or generation, each of which site is of minimum size and density. Preferably, such sites comprise particles of silver or a more noble metal, e.g., palladium or platinum. Suitable photosensitive materials for site production in such methods include silver salts, such as Lippmann emulsions, or silver nitrate, ferric salts and ferric salts in combination with a metallic salt, such as a salt of silver, palladium or platinum, diazonium compounds, dichromate-sensitized colloids, photopolymers and photoresists. Alternatively, the photosensitive material can be hardened by exposure to provide the sites. Where the photosensitive material is silver halide, exposure and development provides a regular array of developed silver grains. Removal of unexposed silver halide by fixing leaves the desired spaced array of sites for growing silver halide grains.

After formation of the sites or nuclei, the silver halide grains may be grown preferentially thereon by, for example, imbibing the photosensitive material with a solution of a water-soluble complex of silver halide complexed with excess halide as described above.

Where the pattern-wise exposure results in a differential hardening of the photosensitive materials, the hardened areas of the photosensitive material will be resistant to the imbibition of the complex whereby water-soluble complex will penetrate the photosensitive material only in the predetermined unexposed, unhardened area (or sites). Upon decomplexation, sites comprising nuclei (unhardened areas) will promote preferential grain growth thereby providing photosensitive silver halide grains in an ordered spaced pattern.

The formation of photosensitive elements employing the above-described relief patterns may be carried out directly using the relief pattern. Such methods are described above. Preferably, however, after forming the original relief pattern by exposure and development, silver halide generation is not carried out on the relief pattern but rather the relief pattern is used to replicate itself. Thus, after the original relief pattern is formed by, for example, the crossed interference pattern exposure and development of a suitable photoresist, electroforming techniques known to the art are used to form a negative replica of the relief pattern and the replica used to emboss a softened polymeric surface to provide duplicates of the original relief pattern. The silver halide grain generating techniques described above are then employed on the duplicated relief patterns to form the photosensitive elements of the present invention. This replication technique provides relatively large quanti- 292–297, and Journal of Applied Photographic Engineering, Vol. 4, No. 2, 1978, M. T. Gale et. al., pg. 41.

It is also known in the art that such gratings can be replicated by applying an electrically conducting layer to the relief pattern formed as above; electroforming a layer of nickel on the conductive layer; separating the resulting electroformed nickel layer and employing said nickel layer as an embossing master. Such a procedure is set forth, for example, in U.S. Pat. No. 4,044,929 issued Aug. 30, 1977.

Suitable methods for making a pattern in a substrate to provide a spaced array of photoreceptors also include direct electron beam writing and exposure through a mask produced by electron beam writing. The radiation employed through a specific mask can be visible light, UV light, X-rays, gamma rays or isotope radiation, so long as the specific mask has sufficient absorption of the exposing radiation to provide a useable pattern in the radiation-sensitive substrate. Such UV and X-ray lithographic techniques are known to the art and are employed in semiconductor microcircuit fabrication. For a review of these methods see "High-resolution Systems for Microfabrication" in Physics Today, November 1979, pgs. 39–45.

A suitable mask can also be produced by modulation of a laser beam as is carried out in the recording of video disc masters. See for example, "Video Disc Technology-A Tutorial Survey", Journal of Applied Photographic Engineering, Volume 4, Number 1, Winter 1978, page 6. The modulated laser beam method could also be applied directly to a substrate without use of a mask.

It is preferred to employ a first and second exposure of the photosensitive material to two interfering coherent beams, wherein the exposures are at an angle to each other, preferably a 90° angle. The intersection of maximum intensities of the two combined exposures will provide a greater degree of modification to the photosensitive material at the points of intersection than the remainder of the photosensitive material. The thus-formed pattern provides sites for silver halide generation.

The detailed structure of the pattern can be controlled somewhat by taking advantage of the non-linear development characteristics of the photoresist and of its varying sensitivity with temperature treatment. Treatment prior to exposure, such as elevated temperature (prebake) or preexposure can be varied. In addition, length of development after exposure can also be varied. For example, with prebake, no preexposure and short development, one can obtain a rectangular array of deep holes in an otherwise relatively flat surface. If the same material were preexposed uniformly to incoherent light and the development were extended, one would obtain instead a rectangular array of steep spires.

Variations in the symmetry of the above described array are also possible. For example, by changing the angle between the two beams after the first exposure, one obtains a different grating spacing for each of the two perpendicular orientations. This can lead to oblong instead of round holes. Alternatively, if the exposure plate is rotated to form an angle other than 90° between the two exposure positions, one would obtain a diamond-shaped rather than a square array. Processes for providing surface relief patterns of predetermined configuration are disclosed and claimed in copending U.S. patent application of James J. Cowen, Arthur M. Gerber and Warren D. Slafer Ser. No. 234,959, filed concurrently herewith and commonly assigned.

The manner of exposure described above provides a predetermined, ordered, spaced array of sites, with a desired uniform geometric configuration, and symmetry.

The preferred source of coherent radiation is a laser. The particular laser will be selected depending upon the radiation absorption and spectral response characteristics of the particular photosensitive material employed.

Other suitable methods of exposure include those mentioned above, i.e., exposure of a photosensitive material by visible light, UV light, X-rays, gamma rays or isotope radiation through a mask or screen formed by electron beam writing. A pattern can also be formed using a modulated laser beam.

One method for the generation of arrayed photosensitive silver halide grains involves the formation of a relief pattern in the photosensitive material where preferential hardening, such as photopolymerization, or solubilization is achieved by the exposure. Development of the exposed photosensitive material would thus result in removal of selected areas of the photosensitive material to provide a relief pattern consisting of a regular array of peaks and valleys. These peaks and valleys provide the sites for the generation of the silver halide grains. Depending upon the specific procedure employed, the silver halide grains may be generated in a regular array on the peaks, the sides of the peaks or in the valleys. Each location offers different advantages.

Depending upon the exposure and degree of development or removal of material to create the relief pattern, specific relief configurations may be obtained. Thus, with low intensity exposure and short time development only so much material is removed as to provide peaks and valleys wherein the peaks constitute a substantially plannar, flat or plateau-like configuration. Conversely, higher intensity exposure and sufficient development to remove a relatively large quantity of material will result in peaks that are pointed.

One method of generating photosensitive silver halide deposits on the peaks (or projections or elevations) of the relief pattern comprises applying polymer, such as gelatin, preferably containing a dissolved or suspended nucleating material, to adhere to the peaks, imbibing into said polymer-coated relief pattern a solution of a water-soluble complex of silver halide complexed with excess halide, and then decomplexing the described complex. It has been found that the thus-formed silver halide deposits are predominantly located on the peaks.

If silver halide grains are desired in the valleys, one method for obtaining such a distribution is to apply the polymer to said relief pattern so that it is only deposited in the valleys, imbibing the polymer with a solution of a water-soluble silver halide complexed with excess halide, and then decomplexing the described complex. In this manner, silver halide deposits are predominantly located in the valleys.

For clarity and simplicity, the above-described procedures have referred to a solution of a water-soluble complex of silver halide complexed with excess halide. Such complexes are known in the art and their utility in forming photosensitive silver halide emulsion layers is described and claimed in U.S. Pat. Nos. 4,153,462; 3,883,355 and 3,941,600. It should be understood that the water-soluble complex of silver halide complexed with excess halide is illustrative of any water-soluble ties of relief patterns quickly and easily without repeated pattern exposure and development of a photosensitive material.

Turning now to the drawings, FIG. 1 is a diagrammatic representation of the preferred exposure system of the present invention. The arrangement is conventional in the art for forming gratings and employs a laser radiation source with the optical system necessary to provide the interference pattern with the desired line spacing. As shown, the optical system provides for a sequential exposure of the target which constitutes a photosensitive material described above. As shown in FIG. 1, light from the laser, polarized perpendicular to the plane of incidence, is split by a 50-50 beam splitter so that half of the light intensity is incident on one mirror and the other half is incident on a second mirror. The light is reflected from each of these mirrors through an expansion lens and a spatial filter such that the expanded beam is incident on the whole target area where the photoresist coated substrate is located. The two intersecting beams, being derived from one coherent source and having traveled along substantially equal paths from the beam splitter, form interference fringes. The spacing (d) between adjacent maxima (or minima) is given by the equation $d = \lambda/(2 \sin \theta)$ in which $\theta$ is the wavelength of the laser light and is the angle of incidence to the target plate of each beam (i.e., one-half of the angle between the two beams).

Exposure is carried out until a sufficient intensity level is attained. Exposure times are related to the size of the target area to be exposed. For example, for the He-Cd laser ($\lambda = 442$ nm) with a spatial filter distance to the target of 50 inches, a 40 times expansion lens and a square target 10 inches on each side, exposure times of up to one hour are necessary. With the argon laser, the exposure times are approximately half as large, since even though the available power is larger, the photoresist is less sensitive at the longer wavelength. After the first exposure, the target is removed from the vacuum platen, which holds the photosensitive material flat during exposure, rotated 90° and replaced in the vacuum platen. A second laser interference pattern exposure is then applied.

Care should be taken to maintain the exposure intensity relatively constant, preferably within a small fraction of a fringe shift at any given point in the target. Means for maintaining such exposure intensity are known to the art; see for example, "Improvement of Recorded Photographic Fringes by Feedback Control", Applied Optics, Vol. 6, No. 6, p. 1097 (1967) and "Stabilization of Holographic Fringes by FM Feedback", Applied Optics, Vol. 7, No. 1, p. 87 (1968).

Figure 2:
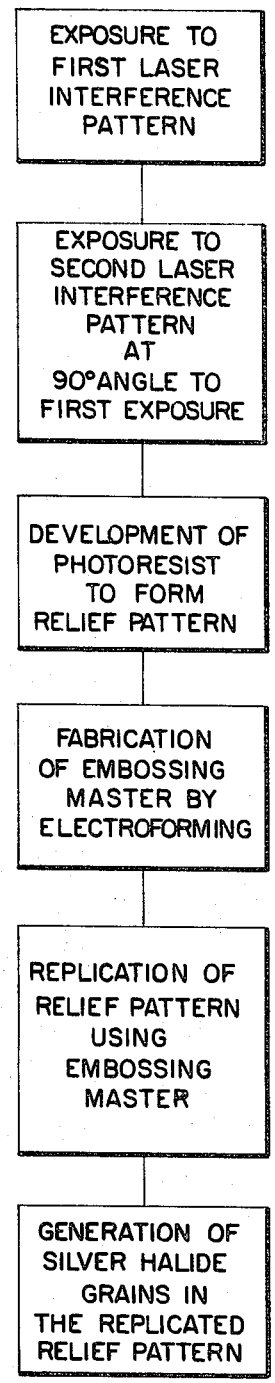
FIG. 2 is a flow diagram of a method of forming photosensitive elements within the scope of the present invention.

FIG. 2 is a flow diagram of one method of forming photosensitive elements within the scope of the present invention. A photosensitive material, specifically a photo-resist, is given a first laser interference pattern exposure, rotated 90° and then given a second laser interference pattern exposure. The photoresist is then developed by conventional techniques to provide the relief pattern for growing grains therein. Using conventional electroforming techniques an embossing master is formed from the original relief image. The embossing master is then employed to replicate the developed photoresist relief pattern in an embossable polymeric material. The embossed polymeric material, which now reproduces the original relief pattern, is employed for the generation of silver halide grains by the various techniques described above.

The following nonlimiting examples illustrate the preparation of the novel elements of the present invention.

EXAMPLE 1

Figure 3:
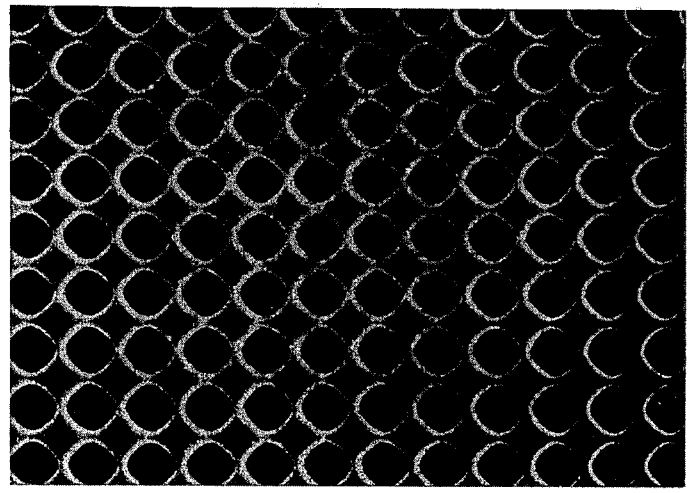
FIG. 3 is a photomicrograph of a relief pattern formed by the procedure of the present invention.
Figure 4:
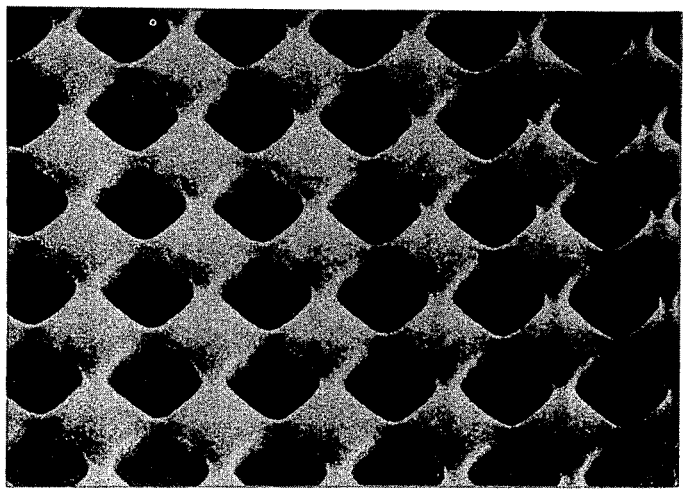
FIG. 4 is a photomicrograph of another emobidiment of a relief pattern formed by the procedure of the present invention.
Figure 5:
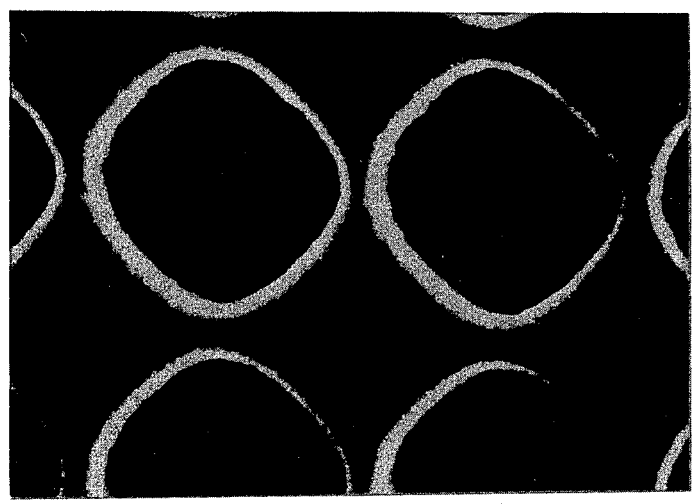
FIG. 5 is a photomicrograph of still another embodiment of a relief pattern formed by the procedure of the present invention.

A 10 mil polyester support about 6 × 10 inches in area was coated with Shipley Photoresist AZ-135OJ, (Shipley Company, Inc., Newton, Mass.), by pouring the photoresist onto the polyester support and allowing the excess to flow off the edges. The thus-coated support was then air dried and was then baked for 20 minutes at 90° C. The photoresist coating was then exposed to interfering beams of radiation from a He-Cd laser at 442 nm with an intensity at the center of the photoresist coating of $16\mu$ watts/cm$^2$ for 34 min. At the end of the exposure period the photoresist coating was rotated 90° and again exposed to the interfering beams of radiation for 31 minutes. The thus-exposed photoresist coating was treated for 16 seconds with Shipley Developer AZ-351 diluted 5 to 1 with water. FIGS. 3, 4, and 5 are scanning electron micrographs of the relief pattern produced by the above-described procedure. Referring to FIG. 3, the dark areas represent the portion of photoresist etched away by the developer as a result of the photosolubilization of the photoresist by exposure to the laser. FIG. 3 is a 9000X magnification scanning electron micrograph at normal incidence of the developed photoresist. The uniform distance betwen the holes should be noted. FIG. 4 is a 20,000X magnification scanning electron micrograph wherein the photoresist was tilted at a 40° angle. Again, the uniformity of the relief pattern and the symmetry of the holes around the two axes should be noted. It should also be noted that the holes appear relatively deep, that is, a considerable degree of etching of the photoresist has occurred but there is little etching of the areas between the holes along the exposure axes even though they received about half as much incident radiation.

FIG. 5 is a 50,000X magnification scanning electron micrograph of the relief pattern formed in Example 1 at normal incidence. Again, the relatively uniform spacing of the holes should be noted.

EXAMPLE 2

Figure 6:
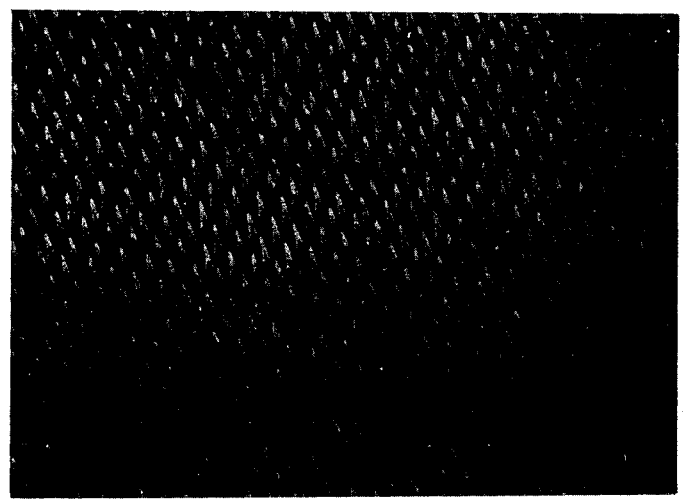
FIG. 6 is a photomicrograph of still another embodiment of a relief pattern formed by the procedure of the present invention.
Figure 7:
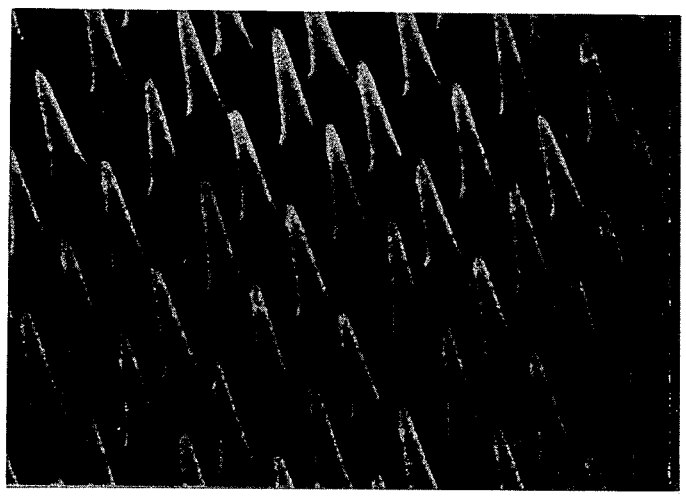
FIG. 7 is a photomicrograph of the relief image of FIG. 6 at a higher magnification.

A 7.5 mil polyester support, 3 × 3 inches in size was coated with photoresist as described in Example 1. The photoresist was then subjected to a pre-exposure for 12 minutes consisting of uniform, noncoherent light from a fluorescent lamp. The photoresist coating was then subjected to interfering beams from a He-Cd laser for 2 minutes at a wavelength of 442 nm with an intensity of $400\mu$ watts/cm$^2$ at the center of the photoresist coating. The photoresist was then rotated 90° and given a second 2 minute exposure to the interfering beams of the laser. The photoresist was then developed for 30 seconds with Shipley Developer AZ-351 diluted 5 to 1 with water. The preexposure to overcome the threshold of sensitivity of the photoresist combined with the longer development period, as well as the higher integrated exposure laser radiation, provided a significantly greater degree of etching of the photoresist than that achieved in Example 1 and, instead of producing the configuration described in Example 1, as holes in a planar surface, produced a relief pattern that can be characterized as a series of peaks extending from a valley floor. FIG. 6 is a 5,000X magnification scanning electron micrograph at a 40° tilt of the relief pattern prepared by the procedure of Example 2. The regular symmetrical rows of peaks with uniform spacing are evident, FIG. 7 is a 20,000X magnification scanning electron micrograph of the same photoresist and again the uniformity of the peaks with respect to spacing, orientation and shape can be seen evidencing the described effect achieved by a greater degree of exposure, preexposure and longer development time.

EXAMPLE 3

Figure 8:
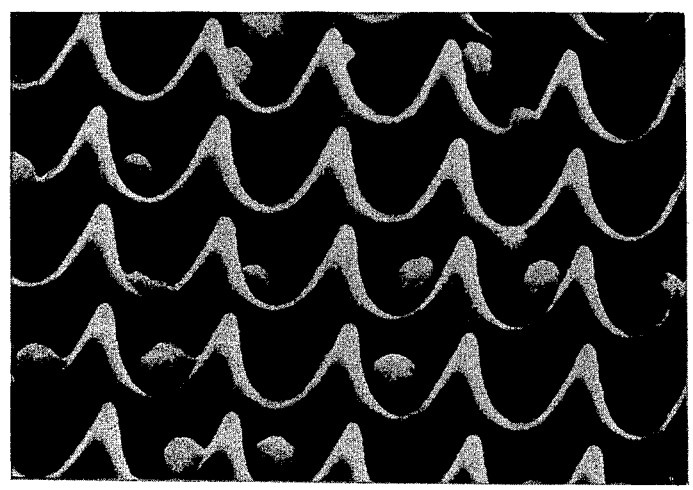
FIG. 8 is a photomicrograph of one embodiment of the novel photosensitive element of the present invention.

A 0.25 inch thick glass plate about 6×14 inches in size was hand-coated with Shipley photoresist AZ-135OJ as in Example 1. The photoresist was then baked for 20 minutes at 90° C. and then given a preexposure for 15 minutes to uniform, noncoherent light from a fluorescent lamp. The photoresist was then exposed to interfering beams from a He-Cd laser at 442 nm with an intensity in the center of the photoresist of $24\mu$ watts/cm$^2$ for 26 minutes. The photoresist was then rotated 90° and the above-described laser exposure repeated for another 26 minutes. The relief pattern was then obtained by developing the photoresist for 25 seconds with Shipley Developer AZ-351 diluted 5 to 1 with water. Silver was then deposited by a vacuum deposition system on the relief image in an amount sufficient to make the surface of the relief image electrically conductive. Employing a nickel sulfamate-nickel chloride electroform solution, 10 mils of nickel was plated over the silver relief pattern. The nickel electroform, which now constituted a negative image of the relief pattern, was removed and employed to emboss a layer of 5 mil cellulose acetate butyrate on a polyester support wherein the cellulose acetate butyrate was softened by a mixture of toluene and acetone in a 9 to 1 volume ratio. The embossing was carried out by superimposing the nickel electroform over the cellulose acetate butyrate layer and passing the thus formed sandwich through motor driven rubber rollers at 60 psi. The cellulose acetate butyrate which now comprises a replication of the original photoresist relief pattern was coated using a #12 wire wound coating rod (R.D. Specialties Co., Webster, NY) with a solution comprising 50 ml of water, 10 g of potassium iodide, 0.25 ml of a 20% solution of diacetone acrylamide/2-acrylamido-2-methylpropane sulfonic acid copolymer at about a 7 to 3 ratio and 1 ml of Neutronyx 600, (5% solution of alkyphenol polyglycol ether containing 9.5 moles of ethylene oxide, sold by Onyx Chemical Company, Jersey City, NJ). After drying this layer, a second layer comprising a 6% solution of gelatin and 0.1% of Neutronyx 600 was applied with a #12 wire wound coating rod. After drying this layer, an aqueous solution of silver bromide complexed with excess bromide was imbibed into the above-described layer by applying the complex solution between the above-described layers and a polyester cover sheet and passing the layers between 0.0050 inch gapped rollers, allowing the cover sheet to remain in place 5 minutes, removing the cover sheet and washing in water for 60 seconds. FIG. 8 is a 20,000X magnification scanning electron micrograph with a 40° tilt of the photosensitive element produced by the procedure of Example 3. Silver iodobromide grains approximately 0.4 microns in diameter are located in the valleys of the replicated relief pattern.

EXAMPLE 4

Figure 9:
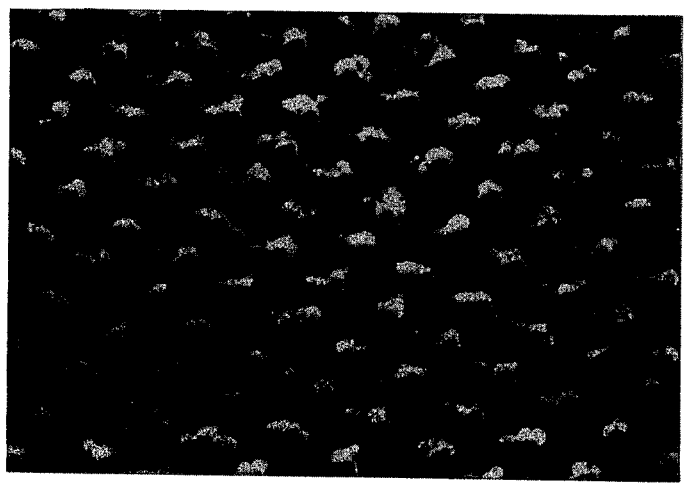
FIG. 9 is a photomicrograph of an alternative embodiment of the novel photosensitive element of the present invention.

An embossed cellulose acetate butyrate relief pattern prepared according to the procedure described in Example 3 was subjected to vacuum deposition of silver at a grazing angle. 500 Å of silver was applied to the relief pattern and was deposited on the sides of the peaks. Subsequent to the silver deposition the element was exposed to bromine vapor to convert the silver to silver bromide. FIG. 9 is a 10,000X magnification scanning electron micrograph at a 40° tilt which illustrates the formation of the silver bromide grains on the sides of the peaks of the relief pattern.

EXAMPLE 5

Figure 10:
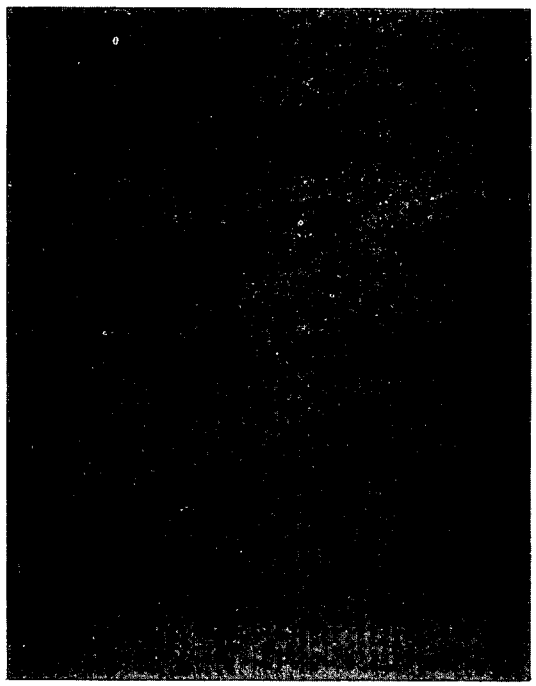
FIG. 10 is a photomicrograph of another embodiment of the novel photosensitive element of the present invention.

An embossed cellulose acetate butyrate relief pattern was prepared according to the procedure of Example 3. About 500 Å of silver was evaporated onto the relief pattern at a grazing angle as described in Example 4. To the relief pattern was then applied with a #12 wire wound coating rod a 4% solution of gelatin and 1% of Miranol J2M-SF (dicarboxylic caprylic derivative sodium salt) Miranol Chemical Co., Inc. Irvington, NJ. The gelatin layer was dried and was then imbibed with a solution of a water-soluble complex of silver bromide complexed with excess bromide by applying the complex solution between a nip formed by a cover sheet and the gelatin-coated relief pattern and passing the layers between a pair of 0.0050 inch gapped rollers. The cover sheet was allowed to remain in place for 15 minutes and then peeled apart, after which the element was given a 2 minute water wash. FIG. 10 is a 1600X magnification optical micrograph at normal incidence of the thus-formed element. The photomicrograph shows silver bromide grains formed in an array determined by the relief image. In the center of the photomicrograph is an area where apparently no evaporated silver was retained and which shows the relief pattern in the underlying cellulose acetate butyrate layer free of silver halide.

EXAMPLE 6

Figure 11:
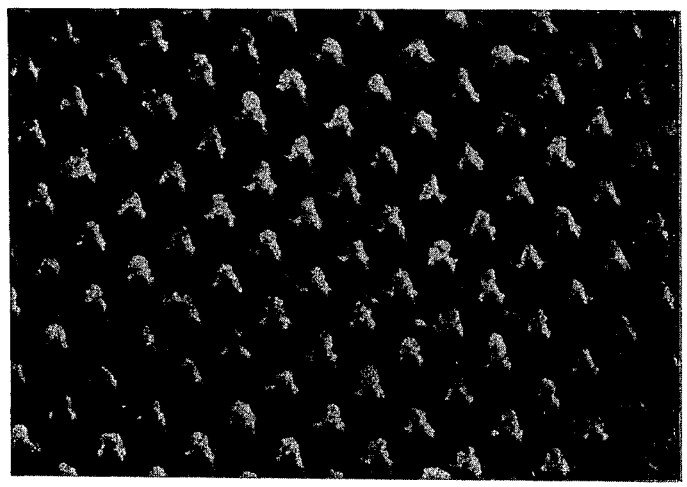
FIG. 11 is a photomicrograph of still another embodiment of the novel photosensitive element of the present invention.

A cellulose acetate butyrate relief pattern was formed according to the procedure of Example 3. Over the relief pattern a solution of diacetone acrylamide/2-acrylamido-2-methyl propane sulfonic acid copolymer at about a 7 to 3 ratio, potassium iodide at 100 mg/ml and Neutronyx 600 at 0.1% was coated with a #12 wire wound rod. After drying, a 6% gelatin solution containing 0.1% Neutronyx 600 was applied with a #12 wire wound rod. This layer was dried and then imbibed with a water-soluble complex of silver bromide according to the procedure of Example 5 and washed with water to effect decomplexation. As determined by analysis, predominantly silver iodide was precipitated. FIG. 11 is a 10,000X magnification scanning electron micrograph at a 40° tilt showing silver halide grains formed on the peaks of the relief image.

EXAMPLE 7

Figure 12:
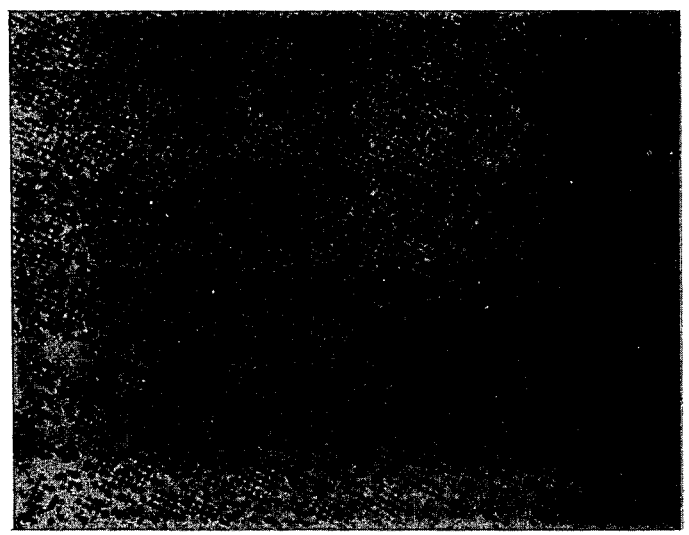
FIG. 12 is a photomicrograph of still another embodiment of the novel photosensitive element of the present invention.
Figure 13:
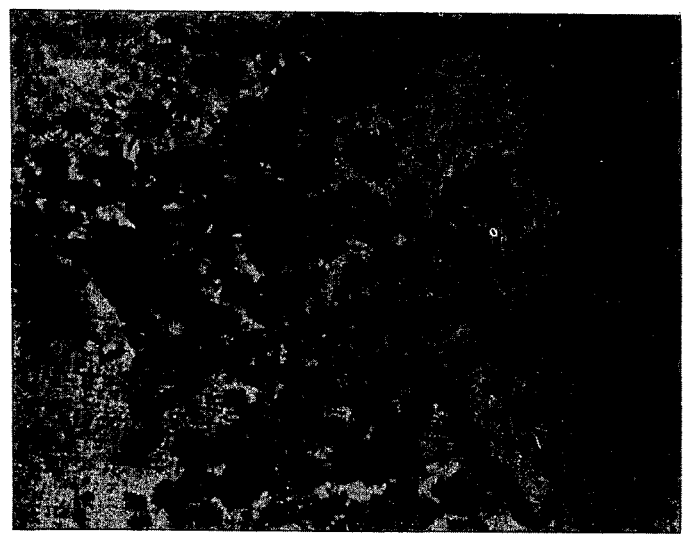
FIG. 13 is a photomicrograph of a processed photosensitive element of the present invention.

An element was prepared as described in Example 6 except that a mixture of potassium iodide and potassium bromide was used in the copolymer subcoat and chloride ion was substituted for bromide in the complex. The thus-formed silver iodobromide grains are shown in FIG. 12 which is an optical micrograph at 1,000X magnification at normal incidence of the element. The thus-produced layer of silver iodobromide grains was exposed to a $160\mu$ watts/cm$^2$ He-Cd laser beam for 5 seconds. The sheet was then processed as a negative with a Type 42 receiving sheet and processing composition (Polaroid Corporation, Cambridge, Mass.). A low density image of the laser exposure was visible in the receiving sheet. FIG. 13, which is a 1,000X magnification optical micrograph at normal incidence of the processed negative shows developed silver in the exposed area.

EXAMPLE 8

The following materials were prepared:

(a) Fine-grain AgIBr microcrystals in gelatin (4 mole percent iodide, gel/Ag ratio 0.1, grain size about 0.1 $\mu$m)

(b) A polyester support carrying a layer of embossed cellulose acetate butyrate thereon prepared as described above (hole diameter about 0.9 $\mu$m and center to center spacing about 1.2 $\mu$m and a hole depth of about 0.9 $\mu$m.

(c) a solution comprising:
4.0 ml ammonium thiocyanate at 60 mg/ml
1.0 ml water
5.0 ml 10% inert gelatin
0.3 ml lithium bromide (12.3 N)

Figure 14:
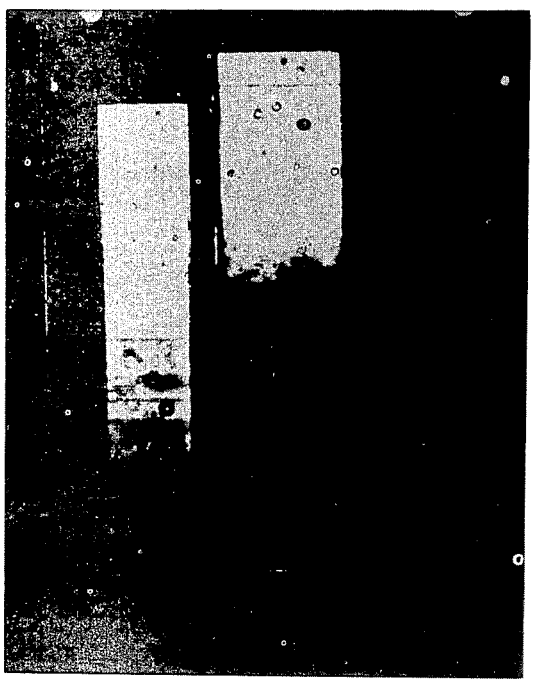
FIG. 14 is a photograph of a step wedge exposure of a photosensitive element of the present invention.
Figure 15:
FIG. 15 is a photograph of a step wedge exposure of a control element for comparison with the photosensitive element of FIG. 14.
Figure 16:
FIG. 16 is a photomicrograph of the photosensitive element of FIG. 14 showing developed silver.

(d) a solution comprising:
10 mg panchromatic sensitizing dye
4 ml 10% inert gelatin
6 ml water The fine-grain emulsion (a) was applied to base (b) with a #3 wire wound rod at a silver coverage of about 95 mg/ft$^2$ using Olin 10G as a surfactant (reaction product of nonyl phenol and glycidol sold by Olin Corp., N.Y., N.Y.). The emulsion was dried and then the base carrying the dried emulsion was positioned between a pair of pressurized rubber rollers with a polyester support carrying a non-embossed layer of cellulose acetate butyrate. The nip formed by the emulsion-carrying base and the strip sheet was filled with solution (c) and the thus-formed sandwich laminated by passing through the rollers at 30 psi. Maintaining the lamination, the materials were heated at 58° C. for two minutes by contact with hot water; chilled for two minutes at approximately $-20°$ C. and then peeled apart. Visual observation showed that the silver halide, which prior to the coalescence step appeared iridescent yellow, which is characteristic of very fine grains, appeared a dull green, characteristic of larger grains in a typical silver iodobromide emulsion. This indicated that single effective grains had been produced by means of dissolution, coalescence and recrystallization. The grains were spectrally sensitized by imbibing with the solution of sensitizing dye (d) by placing the solution in a nip formed by the base carrying the silver halide grains and a polyester base carrying cellulose acetate butyrate. The materials were run through steel rollers with 0.0004 inch gap. After holding the lamination at room temperature for 5 minutes, the lamination was then chilled and the cover sheet peeled off. The thus-formed silver halide grains were exposed at 8 mcs to a Xenon flash and processed with a Type 42 processing composition and a Type 107C receiving sheet (Polaroid Corp., Cambridge, Mass.). The single effective silver halide grains prepared by the above procedure showed a step wedge exposure displaying good $D_{max}/D_{min}$ ratio with a reasonable photographic response (FIG. 14) for an emulsion without chemical sensitization. A control, which was identically treated except for the omission of the reforming step, showed no image (FIG. 15) at all at the same exposure level. FIG. 16 is a photomicrograph of the developed silver of FIG. 14 at 3,000X magnification.

The following example illustrates still another embodiment of forming sites for growing silver halide grains thereon by the generation of sites in a non-relief photosensitive material.

EXAMPLE 9

A polyester support was coated at a coverage of about 10 mg/ft$^2$ with a silver iodobromide Lippman emulsion having grains of about a 0.1 $\mu$m average diameter. The emulsion was then overcoated with about 100 mg/ft$^2$ of gelatin containing mucochloric acid as a hardener. The layer was then exposed to interfering beams from an Argon laser at 488 mm to produce a crossed grating pattern with a grating spacing of about 1.04 $\mu$m. The thus-exposed pattern was developed with a tetramethyl reductic acid developer followed by a fix bath. The existence of sites comprising very small deposits of silver metal found at the cross-over points of the laser beams was proven by illumination with coherent light.

Such silver metal sites may be converted to silver halide by halogenating or by growing silver halide on said metal by, for example, contact with a silver halide complex as described above.

Silver halide grains prepared by the present invention may be chemically sensitized with chemical sensitizing agents known to the art, such as a sulfur, selenium, tellurium compounds, noble metals, such as gold palladium or platinum compounds or combinations of them.

With regard to the use of such chemical sensitizing agents mention may be made of U.S. Pat. Nos. 1,574,944; 1,623,499; 2,410,689; 2,597,856; 2,597,915; 2,487,850; 2,518,698; 2,521,926; and the like, as well as Neblette, C. B., *Photography Its Materials and Processes*, 6th Ed., 1962.

Reduction sensitization of the crystals may also be accomplished employing conventional materials known to the art, such as stannous chloride.

Sensitizers of the solid semiconductor type, such as lead oxide, may also be employed.

Spectral sensitization of the silver halide grains may be accomplished by contact of the crystal composition with an effective concentration of the selected spectral sensitizing dyes dissolved in an appropriate dispersing solvent such as methanol, ethanol, acetone, water and the like; all according to the traditional procedures of the art, as described in Hamer, F. M., *The Cyanine Dyes and Related Compounds*.

The silver halide crystals may also be formed in the presence of chemical or spectral sensitizers and/or such sensitizers may be added after crystal growth and washing.

Additional optional additives, such as coating aids, hardeners, viscosity-increasing agents, stabilizers, preservatives, and the like, for example, those set forth hereinafter, also may be incorporated in the emulsion formulation.

The novel photographic elements of the present invention are particularly suited for use in diffusion transfer film processes.

What is claimed is:

1. A photosensitive element comprising a support carrying single effective photosensitive silver halide grains in a substantially predetermined, regular, geometric spaced array wherein said single effective grains are substantially free of physical contact with one another.

2. The element of claim 1 wherein said grains are substantially uniform in size.

3. The element of claim 1 wherein said grains cover at least 25% of the area of said support.

4. The element of claim 3 wherein said grains cover at least 50% of the area of said support.

5. The element of claim 1 wherein the grain diameter is equal to or less than the unit spacing distance.

6. The element of claims 1 or 5 wherein said grains are about 0.1 to 3 μm in mean diameter.

7. The element of claims 1 or 5 wherein said grains are about 0.5 to 2 μm apart, center to center.

8. The element of claim 1 wherein said silver halide grains comprise silver bromide.

9. The element of claim 1 wherein said silver halide grains comprise silver chloride.

10. The element of claim 1 wherein said silver halide grains comprise silver iodobomide.

11. The element of claim 1 wherein said silver halide grains comprise silver iodobromochloride.

12. The element of claim 1 wherein silver halide grains comprise silver iodochloride.

13. The element of claim 1 wherein said grains are disposed in a water-permeable polymeric layer.

14. The element of claim 1 wherein said grains are disposed in an alkali-permeable polymeric layer.

15. The element of claim 13 where said polymeric layer is gelatin.

16. The element of claim 1 wherein said silver halide grains are spectrally sensitized.

17. The element of claim 1 wherein said silver halide grains are chemically sensitized.

18. The element of claim 1 wherein said silver halide grains are spectrally and chemically sensitized.

19. A method for forming a photosensitive element which comprises providing single effective silver halide grains on a substantially predetermined, regular, geometric spaced array of sites carried by a support; each of said sites adapted to receive a single effective silver halide grain whereby said single effective grains are substantially free of physical contact with one another.

20. The method of claim 19 wherein said predetermined spaced array of sites comprises an embossed pattern.

21. The method of claims 19 or 20 wherein said silver halide grains are provided by applying to said sites a solution of a water-soluble complex of silver ion and then precipitating silver halide grains by decomplexation.

22. The method of claim 21 wherein said complex is silver ion complexed with excess halide.

23. The method of claim 21 wherein said complex is silver ion complexed with thiocyanate.

24. The method of claim 21 wherein said complex is silver ion complexed with halide and thiocyanate.

25. The method of claim 21 wherein said solution of water-soluble complex contains a polymeric binder material.

26. The method of claim 19 wherein said silver halide grains are provided by evaporating silver onto said sites at an angle to the plane of said support and then coverting said silver to silver halide.

27. The method of claim 26 wherein said silver is converted to silver halide by contacting said silver with a halogen.

28. The method of claim 27 wherein said halogen is bromine vapor.

29. The method of claim 28 wherein the thus-formed grains are further grown by contacting said grains with a solution of a water-soluble silver ion complex.

30. The method of claim 26 which includes the step of applying to said sites having silver halide grains thereon a solution of a water-soluble complex of silver ion and growing said grains by precipitating additional silver halide by decomplexation.

31. The method of claims 29 or 30 wherein said complex is silver ion complexed with excess halide.

32. The method of claims 29 or 30 wherein said complex is silver ion complexed with thiocyanate.

33. The method of claims 29 or 30 wherein said complex is silver ion complexed with halide and thiocyanate.

34. The method of claim 19 wherein said sites include a permeable polymeric material.

35. The method of claim 34 wherein said permeable polymeric material is gelatin.

36. The method of claim 34 wherein said permeable polymeric material is 2-acrylamido-2-methylpropane sulfonic acid/acrylamide copolymer.

37. The method of claim 34 wherein said permeable polymeric material is diacetone acrylamide/2-acrylamido-2-methylpropane sulfonic acid copolymer.

38. The method of claim 19 wherein said silver halide grains are provided by the vacuum depostion of silver halide at an angle to the plane of said support.

39. The method of claim 19 wherein said predetermined spaced array of sites comprises nuclei adapted to crystalize silver halide thereon from a solution of a water-soluble complex of silver.

40. The method of claim 39 wherein said complex is silver ion complexed with excess halide.

41. The method of claim 39 wherein said complex is silver ion complexed with thiocyanate.

42. The method of claim 39 wherein said complex is silver ion complexed with halide and thiocyanate.

43. The method of claim 39 wherein said nuclei comprise a noble metal.

44. The method of claim 43 wherein said noble metal is silver.

45. The method of claim 19 wherein said sites are formed by a patterned exposure and development of a photosensitive silver salt.

46. The method of claim 45 wherein said silver salt is a Lippmann emulsion.

47. The method of claim 45 wherein said silver salt is silver nitrate.

48. The method of claim 19 wherein said sites are formed by the patterned exposure of a photosensitive ferric salt.

49. The method of claim 48 wherein $Fe^{+2}$ produced by said exposure of a photosensitive ferric salt reduces a salt of a noble metal.

50. The method of claim 49 wherein said salt of a noble metal is a silver salt.

51. A method for forming a photosensitive element comprising forming on a support a predetermined, regular, geometric spaced array of sites for silver halide grains and providing a single effective photosensitive silver halide grain substantially only at each of said sites and whereby said single effective grains are substantially free of physical contact with one another.

52. The method of claim 51 wherein said predetermined spaced array of sites comprises an embossed pattern in a support.

53. The method of claim 51 wherein said silver halide grains are deposited by applying to said sites a solution of water-soluble complex of silver ion and then precipitating silver halide grains by decomplexation.

54. The method of claim 53 wherein said solution of water-soluble complex contains a polymeric binder material.

55. The method of claim 51 wherein said silver halide grains are provided by evaporating silver onto said sites at an angle to the plane of said support and then converting said silver to silver halide.

56. The method of claim 55 wherein said silver is converted to silver halide by contacting said silver with a halogen.

57. The method of claim 56 wherein said halogen is bromine vapor.

58. The method of claim 57 wherein the thus-formed grains are further grown by contacting said grains with a solution of a water-soluble complex of silver ion.

59. The method of claim 55 which includes the step of applying to said sites having silver halide grains thereon a solution of water-soluble complex of silver ion and growing said grains by precipitating additional silver halide by decomplexation.

60. The method of claim 51 wherein said predetermined spaced array of sites comprises nuclei adapted to crystalize silver halide thereon from a solution of water-soluble complex of silver ion.

61. The method of claim 51 wherein said sites are formed by a patterned exposure and development of a photosensitive silver salt.

62. The method of claim 61 wherein said silver salt is a Lippmann emulsion.

63. The method of claim 61 wherein said silver salt is silver nitrate.

64. The method of claim 51 wherein said sites are formed by the patterned exposure of a photosensitive ferric salt.

65. A method for forming a photosensitive silver halide element which comprises the following steps, in sequence:
(a) exposing a photosensitive material to radiation actinic to said photosensitive material to provide a predetermined, regular, geometric exposure pattern in said photosensitive material;
(b) developing said exposed photosensitive material to provide sites for the generation of silver halide grains; said sites corresponding to said predetermined pattern and said sites being spaced apart from each other;
(c) forming a single effective photosensitive silver halide grain at each of said sites.

66. A method for forming a photosensitive silver halide element which comprises the following steps, in sequence:
(a) exposing a photoresist to radiation actinic to said photoresist to provide a predetermined pattern in said photoresist;
(b) developing the exposed photoresist to provide a relief pattern therein, said relief pattern comprising an ordered spaced array of peaks and valleys; and
(c) forming single effective photosensitive silver halide grains in a spaced array corresponding to said relief pattern.

67. The method of claim 66 wherein said photoresist is exposed by an interference pattern.

68. The method of claim 67 wherein said photoresist is exposed with a first and a second interference pattern at a 90° angle to one another.

69. The method of claim 68 wherein said first and second interference pattern exposures are sequential.

70. The method of claim 68 wherein said first and second interference pattern exposures are simultaneous.

71. The method of claim 66 wherein said radiation is coherent radiation.

72. The method of claim 71 wherein said coherent radiation is a laser beam.

73. The method of claim 66 wherein said relief pattern is formed by photosolubilization of said photoresist.

74. The method of claim 66 wherein said relief pattern is formed by photopolymerization.

75. The method of claim 66 wherein said peaks constitute a substantially planar configuration.

76. The method of claim 66 wherein said peaks are pointed.

77. The method of claim 66 wherein said silver halide grains are formed on top of said peaks.

78. The method of claim 66 wherein said silver halide grains are formed in said valleys.

79. The method of claim 66 wherein said silver halide grains are formed on the sides of said peaks.

80. The method of claim 66 wherein step (b) includes the step of electroforming said relief pattern to form an embossing master and replicating said relief pattern in an embossable polymeric layer.

81. The method of claim 66 which includes the steps of vacuum depositing silver at an acute angle to the plane of said relief pattern and forming silver halide at the sites of said deposited silver.

82. The method of claim 81 wherein said deposited silver is converted to silver halide by halogenating said silver.

83. The method of claim 81 which includes the step of applying a permeable polymeric layer over said relief pattern having silver deposited therein, applying a solution of a water-soluble complex of silver and decomplexing said complex whereby silver halide is deposited at the sites of said evaporated silver.

84. The method of claim 83 wherein said complex is silver complexed with excess halide.

85. The method of claim 83 wherein said complex is silver complexed with thiocyanate.

86. The method of claim 83 wherein said complex is silver complexed with halide and thiocyanate.

87. The method of claim 83 wherein said permeable polymeric layer comprises gelatin.

88. The method of claim 83 wherein said permeable polymeric layer also includes a water-soluble halide salt.

89. The method of claim 66 which includes the step of chemically sensitizing said silver halide grains.

90. The method of claim 66 which includes the step of spectrally sensitizing said silver halide grains.

91. A method for forming a photosensitive silver halide element which comprises the following steps, in sequence:
(a) exposing a substantially grainless photosensitive material to radiation actinic to said photosensitive material to provide a regular, geometric spaced pattern of exposure sites in said photosensitive material;
(b) developing said pattern of exposure sites to provide nuclei at said sites in an array corresponding to said pattern; and
(c) forming photosensitive silver halide grains on said nuclei.

92. The method of claim 91 wherein said photosensitive material is exposed by an interference pattern.

93. The method of claim 92 wherein said photosensitive material is exposed with a first and a second interference pattern at about a 90° angle to one another.

94. The method of claim 93 wherein said first and second interference pattern exposures are sequential.

95. The method of claim 93 wherein said first and second interference pattern exposures are substantially simultaneous.

96. The method of claim 91 wherein said radiation is coherent radiation.

97. The method of claim 96 wherein said radiation is a laser beam.

98. The method of claim 91 wherein said photosensitive material is silver halide.

99. The method of claim 91 wherein said photosensitive material is dichromated gelatin.

100. The method of claim 91 wherein said photosensitive material comprises ferric salts.

101. The method of claim 91 wherein said photosensitive material also includes a soluble silver salt.

102. The method of claim 91 wherein said photosensitive material also includes a soluble salt of platinum or palladium.

* * * * *